United States Patent
Kato et al.

(10) Patent No.: US 7,511,306 B2
(45) Date of Patent: Mar. 31, 2009

(54) SEMICONDUCTOR LIGHT EMITTING DEVICE AND APPARATUS HAVING A TRANSLUCENT CONDUCTIVE FILM

(75) Inventors: Yuko Kato, Kanagawa (JP); Hidefumi Yasuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 11/342,539

(22) Filed: Jan. 31, 2006

(65) Prior Publication Data
US 2007/0096110 A1    May 3, 2007

(30) Foreign Application Priority Data
Oct. 27, 2005    (JP)    ............... 2005-313175

(51) Int. Cl.
*H01L 33/00* (2006.01)
(52) U.S. Cl. .................. 257/79; 257/13; 257/100; 257/101; 257/102; 257/103; 257/E51.022; 257/E51.018
(58) Field of Classification Search .................. 257/13, 257/79–103, E51.018, E51.022
See application file for complete search history.

(56) References Cited

U.S. PATENT DOCUMENTS

| | | | |
|---|---|---|---|
| 6,225,648 B1 * | 5/2001 | Hsieh et al. ................ | 257/95 |
| 6,522,676 B1 | 2/2003 | Goto et al. | |
| 2002/0125494 A1 * | 9/2002 | Isokawa .................... | 257/99 |
| 2003/0222269 A1 * | 12/2003 | Lin et al. .................. | 257/99 |
| 2005/0189556 A1 | 9/2005 | Yasuda et al. | |
| 2006/0163588 A1 * | 7/2006 | Udagawa .................. | 257/88 |
| 2007/0018183 A1 * | 1/2007 | Denbaars et al. ............. | 257/98 |

FOREIGN PATENT DOCUMENTS

| | | |
|---|---|---|
| JP | 2004-103710 | 4/2004 |
| TW | 237410 | 8/2005 |

OTHER PUBLICATIONS

U.S. Appl. No. 11/538,646, filed Oct. 4, 2006, Kato, et al.
U.S. Appl. No. 11/143,993, filed Jun. 3, 2005, Kenichi Ohashi, et al.

\* cited by examiner

*Primary Examiner*—Wai-Sing Louie
*Assistant Examiner*—Marc Armand
(74) *Attorney, Agent, or Firm*—Oblon, Spivak, McClelland, Maier & Neustadt, P.C.

(57) ABSTRACT

A semiconductor light emitting device includes: a semiconductor laminated body including a light emitting layer and having a light extraction surface for light emitted from the light emitting layer, a conductive film provided on the light extraction surface of the semiconductor laminated body and being translucent to the light emitted from the light emitting layer and an electrode provided above the conductive film. The conductive film has at least two levels of thickness.

20 Claims, 13 Drawing Sheets

US 7,511,306 B2

SEMICONDUCTOR LIGHT EMITTING DEVICE AND APPARATUS HAVING A TRANSLUCENT CONDUCTIVE FILM

CROSS-REFERENCE TO RELATED APPLICATIONS

This application is based upon and claims the benefits of priorities from the prior Japanese Patent Application No. 2005-313175, filed on Oct. 27, 2005; the entire contents of which are incorporated herein by reference.

BACKGROUND OF THE INVENTION

1. Field of the Invention

This invention relates to a semiconductor light emitting device and apparatus, and more particularly to a semiconductor light emitting device and apparatus having a translucent conductive film on its light extraction surface.

2. Background Art

A semiconductor light emitting device, such as a light emitting diode (LED), that uses low-resistance metal oxides such as indium tin oxide (ITO) as a translucent current diffusion layer provided on its light extraction surface, is disclosed in JP 2004-103710A, for example.

A thick current diffusion layer is required for sufficient diffusion of current throughout the light emitting layer. However, a thick current diffusion layer increases the light absorption therein, which decreases the efficiency of light extraction to the outside of the device. On the other hand, a thin current diffusion layer is required in order to increase optical transmittance for higher efficiency of light extraction to the outside of the device. However, a thin current diffusion layer increases the lateral electrical resistance of the device, which will cause insufficient current diffusion throughout the light emitting layer. It is thus difficult to achieve compatibility between current diffusion and light extraction in the current diffusion layer.

SUMMARY OF THE INVENTION

According to another aspect of the invention, there is provided a semiconductor light emitting device comprising:
a semiconductor laminated body including a light emitting layer and having a light extraction surface for light emitted from the light emitting layer;
a conductive film provided on the light extraction surface of the semiconductor laminated body and being translucent to the light emitted from the light emitting layer; and
an electrode provided above the conductive film,
the conductive film having at least two levels of thickness.

According to another aspect of the invention, there is provided a semiconductor light emitting device comprising:
a semiconductor laminated body including a light emitting layer and having a light extraction surface for light emitted from the light emitting layer;
a conductive film provided on the light extraction surface of the semiconductor laminated body and being translucent to the light emitted from the light emitting layer; and
an electrode provided above the conductive film,
the conductive film being provided with a sloped thickness.

According to another aspect of the invention, there is provided a semiconductor light emitting apparatus comprising:
a mounting member;
a semiconductor light emitting device mounted on the mounting member; and
resin sealing the semiconductor light emitting device,
the semiconductor light emitting device having:
a semiconductor laminated body including a light emitting layer and having a light extraction surface for light emitted from the light emitting layer;
a conductive film provided on the light extraction surface of the semiconductor laminated body and being translucent to the light emitted from the light emitting layer; and
an electrode provided above the conductive film,
the conductive film having at least two levels of thickness or being provided with a sloped thickness.

DETAILED DESCRIPTION OF THE INVENTION

Embodiments of the invention will now be described with reference to the drawings.

First Embodiment

Figure 1:
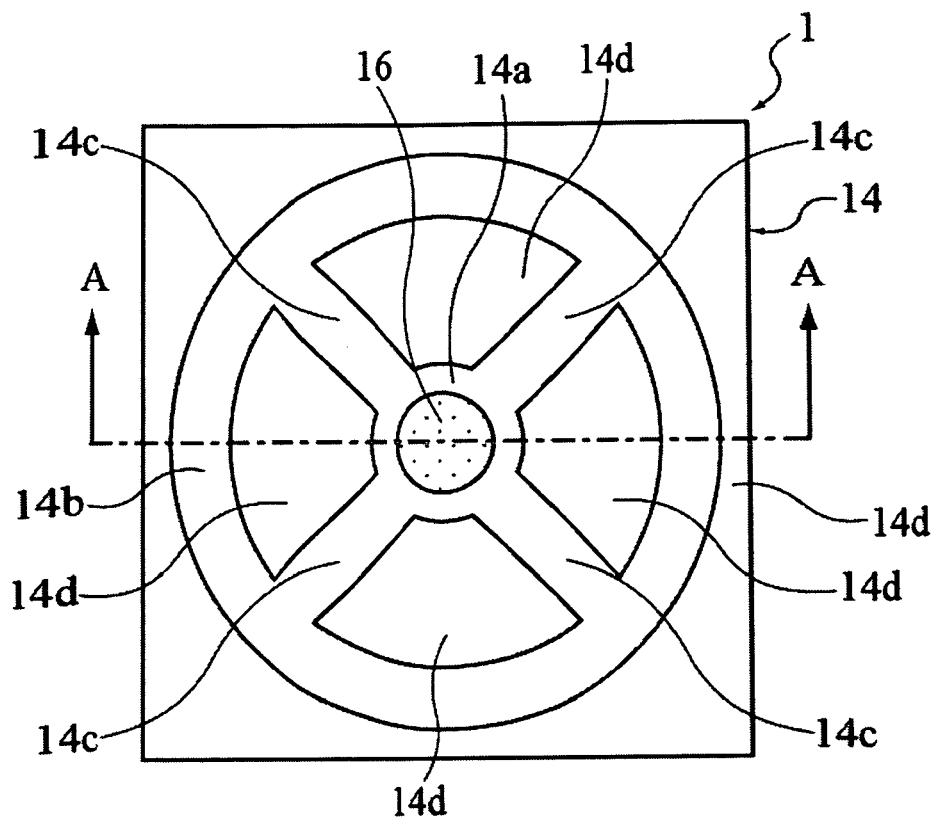
FIG. 1 is a schematic view illustrating the top side structure of a relevant part of a semiconductor light emitting device according to a first embodiment of the invention.

FIG. 1 is a schematic view illustrating the top side structure of a relevant part of a semiconductor light emitting device 1 according to a first embodiment of the invention.

Figure 2:
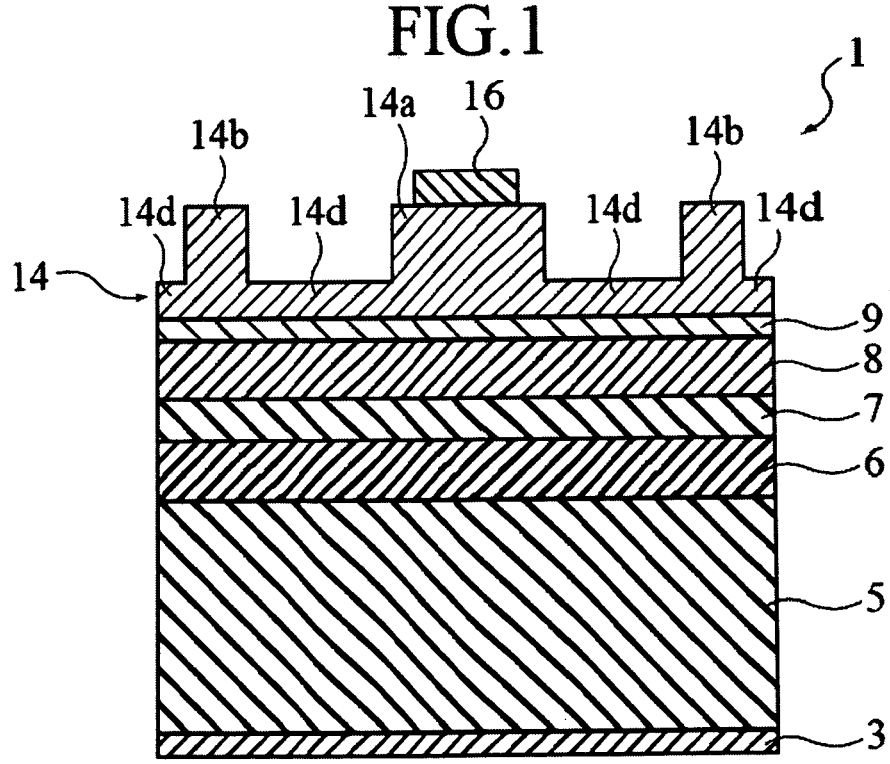
FIG. 2 is a cross section along line A-A in FIG. 1.

FIG. 2 is a cross section along line A-A in FIG. 1.

The semiconductor light emitting device 1 according this embodiment comprises a semiconductor laminated body 5 to 9 including a light emitting layer 7; a translucent conductive film 14 provided on the top side of the semiconductor laminated body 5 to 9, the top side being one of the light extraction surfaces; an electrode 16 provided on the conductive film 14; and an electrode 3 provided on the rear side of the semiconductor laminated body 5 to 9.

The semiconductor laminated body has a structure including, for example, a cladding layer 6, a light emitting layer (active layer) 7, a cladding layer 8, and a contact layer 9 sequentially laminated on a substrate 5. The cladding layer 6, light emitting layer 7, cladding layer 8, and contact layer 9 are epitaxially grown in turn on the substrate 5, and the substrate 5 is left intact. Alternatively, when an epitaxial growth substrate for the above layers acts as an absorbing layer for light emitted from the light emitting layer 7, the above layers may be epitaxially grown on the epitaxial growth substrate, and the epitaxially grown layers may be affixed to another substrate that does not act as an absorbing layer for light emitted from the light emitting layer 7. Subsequently, the original epitaxial growth substrate may be removed.

The light emitting layer 7 is sandwiched between the cladding layers 6 and 8 that have a larger bandgap than the light emitting layer 7. One of the cladding layers 6 and 8 is made of a first conductivity type semiconductor, and the other is made of a second conductivity type semiconductor. In this example, for instance, the cladding layer 6 is made of an n-type semiconductor, and the cladding layer 8 is made of a p-type semiconductor. Furthermore, the substrate 5 is made of an n-type semiconductor. By way of example, the light emitting layer 7 and the cladding layers 6 and 8 may be made of semiconductors such as InGaAlP, InGaAlAs, InGaAsP, InGaAlN, InGaP, InGaN, InAlP, AlGaAs, AlGaN, GaP, GaN, and InP.

The contact layer 9 interposed between the conductive film 14 and the cladding layer 8 serves to reduce resistance between the conductive film 14 and the cladding layer 8. The contact layer 9 may be made of p-type GaAs, for example.

The conductive film 14 is electrically conductive, and translucent to light emitted from the light emitting layer 7. For example, the conductive film 14 may be made of metal oxides such as ITO (indium tin oxide), IZO (indium zinc oxide), and zinc oxide, metal nitrides such as titanium nitride, or other metal compounds. The conductive film 14 is formed on the contact layer 9 by methods such as sputtering, vacuum deposition, or spray pyrolysis, and then removed in part by photolithography and etching. The etching depth does not reach the contact layer 9 underlying the conductive film 14, and therefore the contact layer 9 is not exposed.

By partial removal of the conductive film 14, projections and depressions are formed on the surface of the conductive film 14 opposite to its side contiguous to the contact layer 9, and thereby different thicknesses are provided in the conductive film 14. In this example, two different levels of thickness are provided, including large thickness portions 14a to 14c and small thickness portions 14d having a smaller thickness than the large thickness portions. The top surfaces of the large thickness portions 14a to 14c and the small thickness portions 14d are made substantially parallel to the top side (light extraction surface) of the semiconductor laminated body 5 to 9. The side face of the step portion (inner wall of the depression) between the large thickness portion 14a to 14c and the small thickness portion 14d is made substantially perpendicular to the top side of the semiconductor laminated body 5 to 9.

The thickness of the small thickness portions 14d is about one tenth of the thickness of the large thickness portions 14a to 14c. For example, the large thickness portions 14a to 14c have a thickness of 0.5 micrometer, the small thickness portions 14d have a thickness of 0.05 micrometer, and the step height between the large thickness portion 14a to 14c and the small thickness portion 14d is 0.45 micrometer.

As shown in FIG. 1, the large thickness portions 14a to 14c are arranged symmetrically with respect to the center of the top side of the semiconductor laminated body 5 to 9. More specifically, the large thickness portions include a first portion 14a that is substantially circular and provided substantially at the in-plane center of the conductive film 14, four second portions 14c extending radially from the first portion 14a toward the periphery of the conductive film 14, and a third portion 14b that is shaped as a circular ring and provided so as to surround the first and second portions 14a, 14c. The remaining portion other than the first to third portions 14a, 14b, 14c all constitutes the small thickness portion 14d.

The second portions 14c are each shaped as a line connected at one end to the first portion 14a and equally spaced along the circumferential direction of the first portion 14a. The number of the second portions 14c is not limited to four. The other end of the second portion 14c is connected to the third portion 14b. The first portion 14a is not limited to being circular, but may be rectangular or the like. Likewise, the third portion 14b is not limited to being shaped as a circular ring, but may be shaped as a rectangular ring.

An electrode 16 is provided on top of the first portion 14a of the conductive film 14. The electrode 16 functions as a bonding pad for bonding a wire, which is exemplarily made of Au, that interconnects between the semiconductor light emitting device 1 and an external circuit, not shown. The electrode 16 is made of materials containing Au or Au alloy, for example, and formed by methods such as vacuum deposition or sputtering. The electrode 16 is formed, for example, in a circular shape like the first portion 14a, but has a diameter smaller than the first portion 14a. An electrode 3 made of materials containing Au or Au alloy is also formed on the rear side of the substrate 5 by methods such as vacuum deposition or sputtering. The electrode 3 is formed all over the rear side of the substrate 5.

In the semiconductor light emitting device 1 configured as above, current injected into the light emitting layer 7 via the two electrodes 16 and 3 causes electrons and holes to be recombined, thereby emitting light from the light emitting layer 7. The current flows from the electrode 16 serving as a p-side electrode toward the electrode 3 serving as an n-side electrode. The light emitted from the light emitting layer 7 is transmitted through the conductive film 14 translucent to this light and extracted outside from the top face of the semiconductor light emitting device 1.

The thick portions 14a to 14c of the conductive film 14 have smaller in-plane (lateral) electrical resistance than the thin portions 14d, and therefore facilitate current diffusion in the in-plane direction of the device. More specifically, in the light emitting layer 7, current diffusion into the portions other than the central portion, where the electrode 16 is located, is facilitated, which enables a sufficient amount of current to be supplied throughout the light emitting layer 7. Furthermore, current can be uniformly spread throughout the light emitting layer 7 in a balanced manner because the large thickness portions 14a to 14c are symmetrically arranged with respect to the center of the top side of the semiconductor laminated body. As a result, light emission can be obtained in a broad area of the light emitting layer 7, and the amount of light emission from the entire light emitting layer 7 can be increased.

On the other hand, the thin portions 14d of the conductive film 14 have higher transmittance for light emitted from the light emitting layer 7 than the thick portions 14a to 14c, and therefore superior in the efficiency of light extraction to the outside of the device.

Furthermore, although small in thickness, the thin portions 14d also have the effect of in-plane current diffusion because of their electrical conductivity. Therefore, especially when the device has a large planar size, current diffusion effect can be obtained without significantly increasing the area ratio of the thick portions 14a to 14c, and increase of area of the thick portions 14a to 14c, which are less translucent than the thin portions 14d, can be mitigated. As a result, the light extraction efficiency is increased.

As described above, according to this example, part of the conductive film 14 is relatively thickened to act as a path for current diffusion, and the remaining part is thinned to increase optical transmittance. This enables to increase the amount of light emission from the entire light emitting layer 7 and to improve the efficiency of extracting light emitted from the light emitting layer 7 to the outside of the device. Consequently, the semiconductor light emitting device 1 can be provided with higher brightness.

Figure 3:
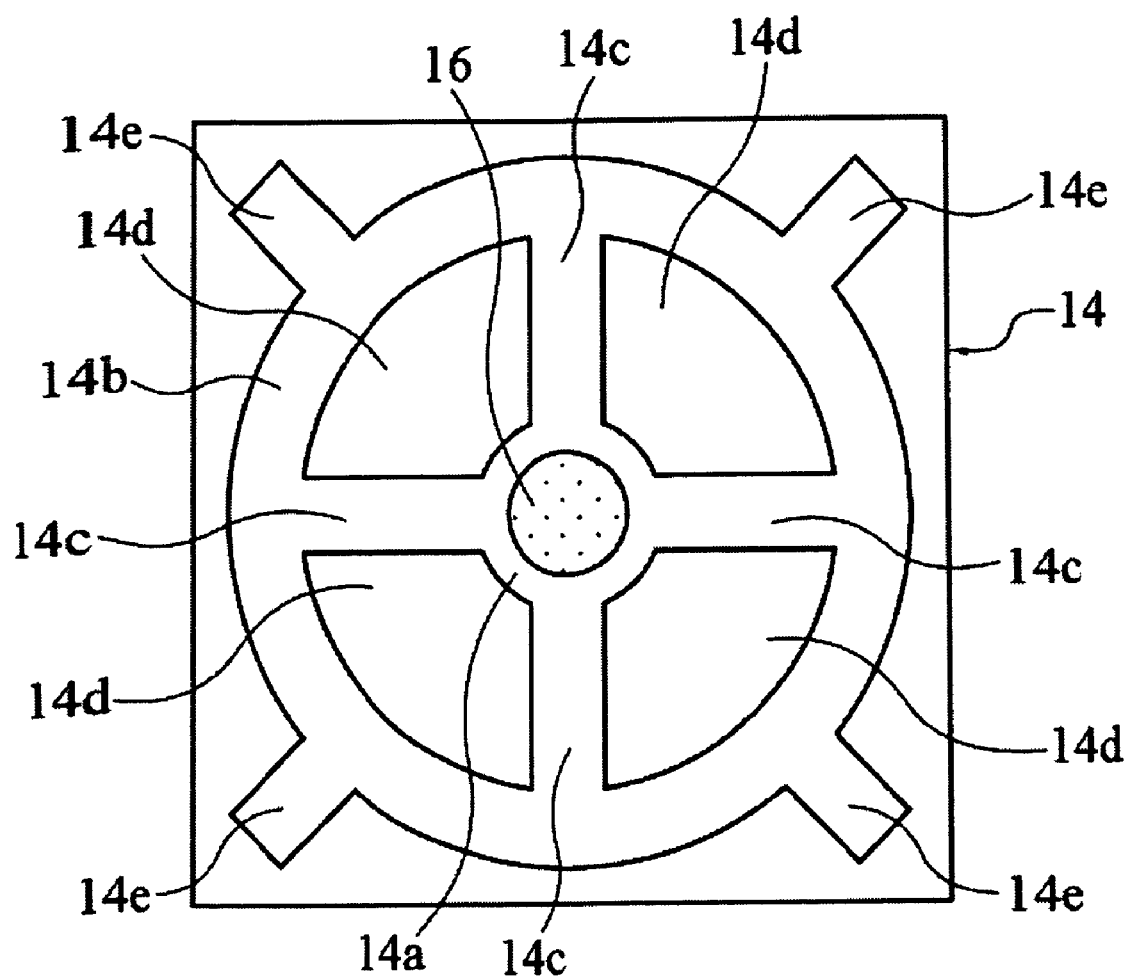
FIG. 3 is a schematic top view showing a variation of the conductive film pattern of the semiconductor light emitting device shown in FIG. 1.

While the example shown in FIG. 1 illustrates the thick, second portions 14c of the conductive film 14 being arranged to extend from the center toward the four corners, the second portions 14c may be arranged to extend in any directions other than toward the four corners, as in another example shown in FIG. 3. Furthermore, in the example of FIG. 3, fourth portions 14e extending from the third portion 14b toward the four corners are provided to facilitate current diffusion into a broader area.

Other embodiments of the invention will be described below. Elements similar to those described previously are marked with the same reference numerals and not described in detail.

Second Embodiment

Figure 4:
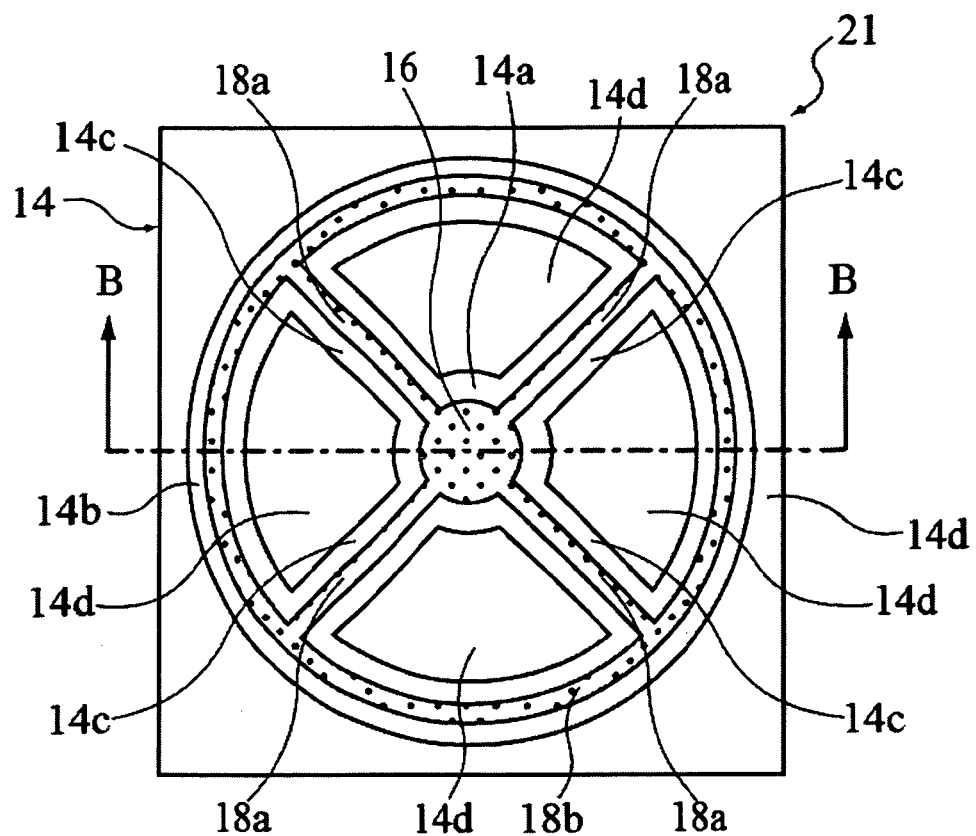
FIG. 4 is a schematic view illustrating the top side structure of a relevant part of a semiconductor light emitting device according to a second embodiment of the invention.

FIG. 4 is a schematic view illustrating the top side structure of a relevant part of a semiconductor light emitting device 21 according to a second embodiment of the invention.

Figure 5:
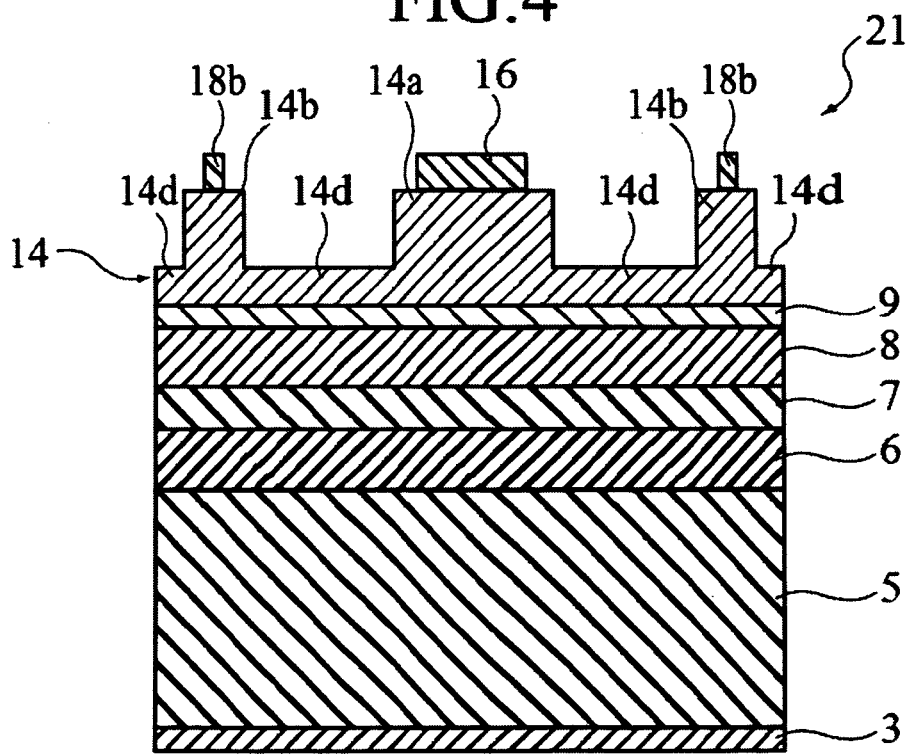
FIG. 5 is a cross section along line B-B in FIG. 4.

FIG. 5 is a cross section along line B-B in FIG. 4.

The semiconductor light emitting device 21 according to this embodiment is different from the semiconductor light emitting device 1 according to the first embodiment described above in that thin line electrodes 18a, 18b are provided on the second and third portions 14c, 14d, respectively, which are the thick portions of the conductive film 14. The thin line electrodes 18a, 18b are, for example, formed from the same material as the electrode (bonding pad) 16 by the same process. The electrode 16 and the thin line electrodes 18a, 18b have lower resistance than the translucent conductive film 14. The electrode 16 and the thin line electrodes 18a, 18b have a thickness of about 1 micrometer, for example.

Each of the four thin line electrodes 18a is connected at one end to the electrode 16 and extends radially on the second portion 14c of the conductive film 14 toward the periphery. The other end is connected to the thin line electrode 18b. The thin line electrode 18b is shaped as a circular ring like the third portion 14b of the conductive film 14 and provided on the third portion 14b. The thin line electrodes 18a, 18b have a smaller width than the second and third portions 14c, 14b of the conductive film 14, respectively.

According to this example, in addition to the thick portions 14c, 14b of the conductive film 14, the thin line electrodes 18a, 18b having lower resistance further facilitate in-plane current diffusion.

Figure 6:
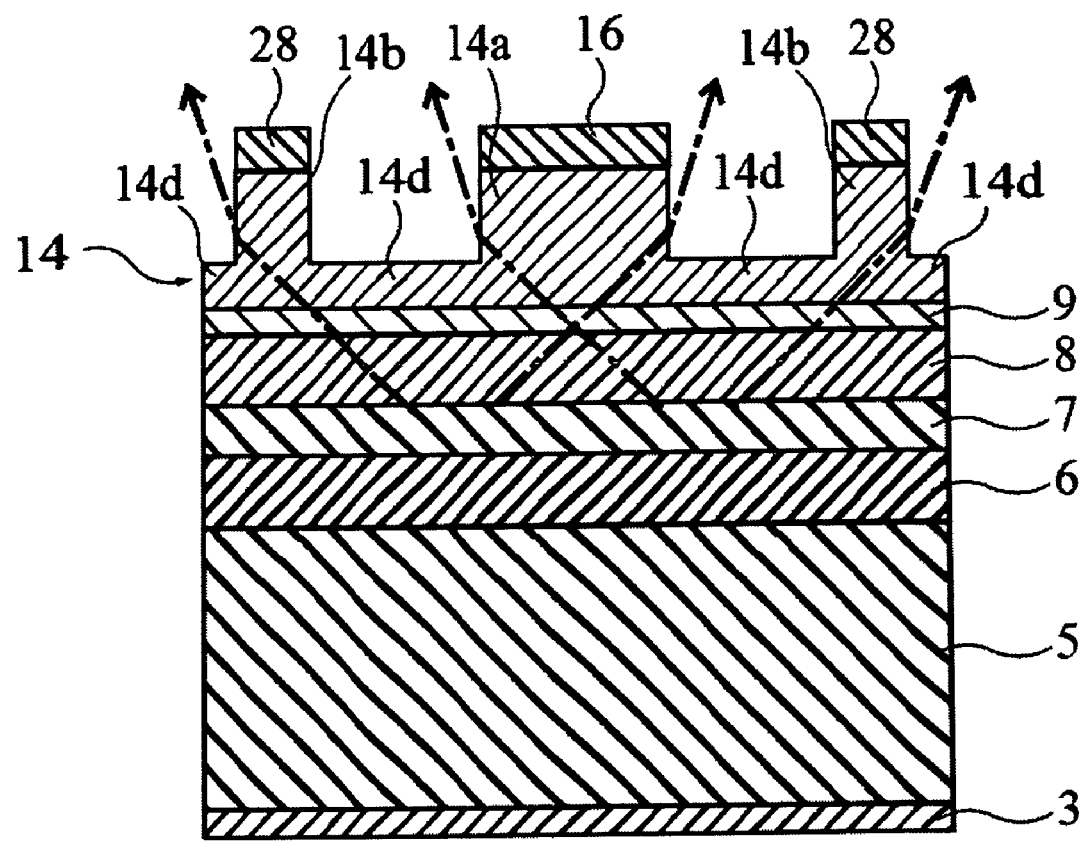
FIG. 6 is a schematic cross section showing a variation of the semiconductor light emitting device shown in FIG. 5.

FIG. 6 shows another example in which the top side of the thickest portions of the conductive film 14 is entirely covered with electrodes. In the thickest portions of the conductive film 14, the first portion 14a is overlaid with an electrode (bonding pad) 16 having the same diameter. The third portion 14b, which is another thick portion of the conductive film 14, is overlaid with an electrode 28 having the same width. Furthermore, although not shown in the cross section of FIG. 6, the radial, second portions 14c shown in the top view of FIG. 1 are also overlaid with electrodes having the same width. While the top side of the thick portions 14a to 14c of the conductive film 14 are covered with the opaque electrodes 16, 28, light can be extracted from the side face of the thick portions 14a to 14c of the conductive film 14 because the thick portions 14a to 14c protrude from the thin portions 14d.

In the conductive film 14, the thick portions 14a to 14c have a thickness of, e.g., 0.5 micrometer. The thin portions 14d have a thickness of, e.g., 0.05 micrometer. The step height between the thick portion 14a to 14c and the thin portion 14d is, e.g., 0.45 micrometer. The thin line electrode 28 and the underlying thick portions 14b, 14c of the conductive film 14 have a width of, e.g., 0.5 to 2 micrometers. In this example, the side face of the thick portions 14a to 14c have a relatively large area of about 0.45 to 1.8 times the area of the top side of the thick portions covered with the electrodes 16 and 28. At the same time, because of refractive index difference relative to resin sealing the device, light emitted from the side face is refracted toward the normal to the device surface (light extraction surface) as indicated by dot-dashed lines in FIG. 6. In this way, if electrodes, even opaque, are provided on the thick portions of the conductive film 14, the effect of light extraction from the side face of the thick portions is expected, which contributes to increased brightness of the semiconductor light emitting device.

Third Embodiment

Figure 7:
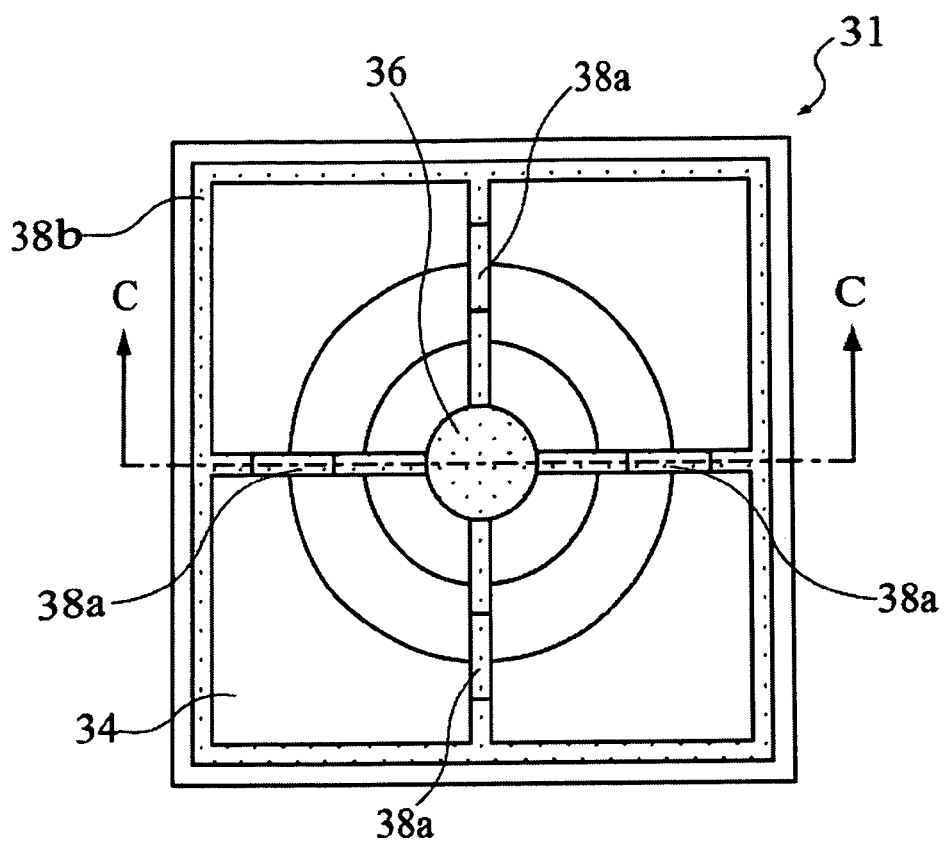
FIG. 7 is a schematic view illustrating the top side structure of a relevant part of a semiconductor light emitting device according to a third embodiment of the invention.

FIG. 7 is a schematic view illustrating the top side structure of a relevant part of a semiconductor light emitting device 31 according to a third embodiment of the invention.

Figure 8:
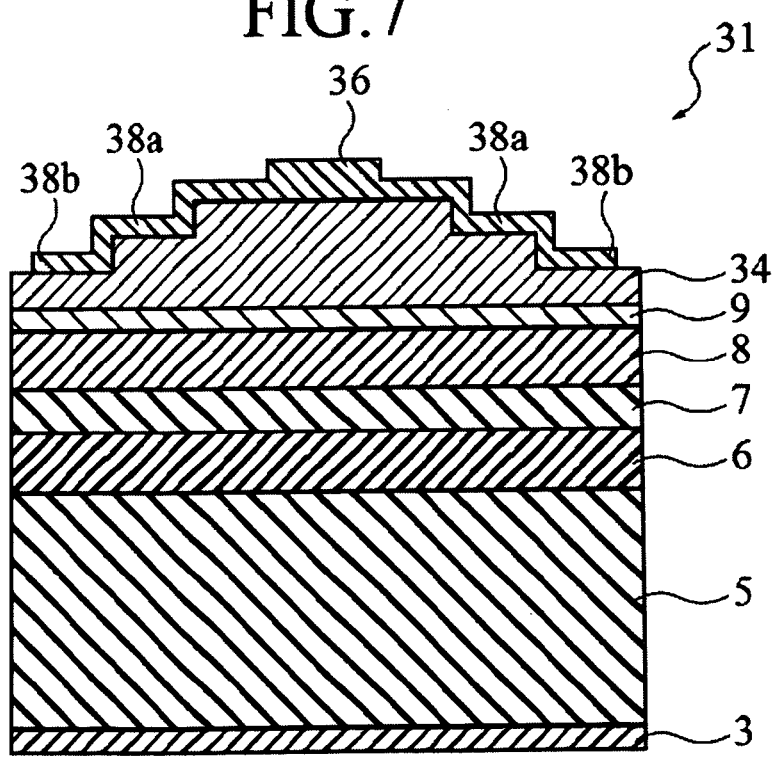
FIG. 8 is a cross section along line C-C in FIG. 7.

FIG. 8 is a cross section along line C-C in FIG. 7.

In this example, a conductive film 34 translucent to light emitted from the light emitting layer 7 is formed in three different levels of thickness. The conductive film 34 is provided on the contact layer 9 and steps are formed in a staircase pattern on the side opposite to the side contiguous to the contact layer 9. The side face of the step portion of the conductive film 34 is made substantially perpendicular to the light extraction surface.

The conductive film 34 is thinned stepwise from the center toward the periphery of the light extraction surface. The conductive film 34 is thickest in the vicinity of the center of the light extraction surface, on which an electrode 36 serving as a bonding pad is provided. The thickest portion of the conductive film 34 has a circular planar shape, which is surrounded by the second thickest portion. The region outside the second thickest portion is all made thinnest. In this way, the conductive film 34 is thinned stepwise with the distance from the electrode (bonding pad) 36 that receives current supply, thereby compensating for optical transmission loss as much as possible in the region where current diffusion tends to be insufficient and the amount of light emission tends to decrease, so that a larger amount of light can be extracted outside.

The electrodes provided on the conductive film 34 includes the above-described bonding pad or electrode 36, thin line electrodes 38a consisting of, e.g., four members and extending radially toward the periphery of the conductive film 34, and a thin line electrode 38b provided on the thinnest portion of the conductive film 34 in the vicinity of its periphery and shaped as a rectangular frame. The thin line electrodes 38a are connected at one end to the electrode 36 and at the other end to the thin line electrode 38b, and extend between the electrode 36 and the thin line electrode 38b so as to cover the steps of the conductive film 34. These electrodes are made of metal or alloy material having lower resistance than the conductive film 34 like the first embodiment described above.

The thin line electrodes 38a, 38b facilitate improving current diffusion into the region far from the bonding pad or electrode 36. Furthermore, current can be uniformly spread throughout the light emitting layer 7 in a balanced manner because the thin line electrodes 38a, 38b and the stepwise pattern of the conductive film 34 are symmetrically arranged with respect to the center of the light extraction surface.

According to this example as well, part of the conductive film 34 is relatively thickened to facilitate current diffusion, and the remaining part is thinned to increase optical transmittance. This enables to increase the amount of light emission from the entire light emitting layer 7 and to improve the efficiency of extracting light emitted from the light emitting layer 7 to the outside of the device. Consequently, the semiconductor light emitting device 31 can be provided with higher brightness.

Fourth Embodiment

Figure 9:
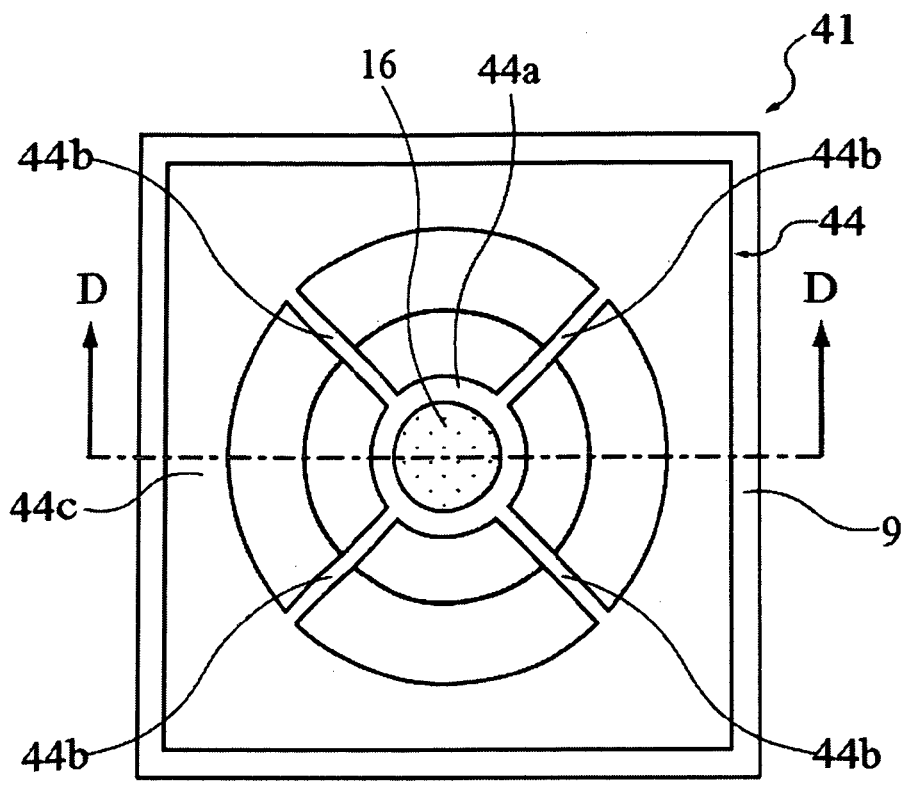
FIG. 9 is a schematic view illustrating the top side structure of a relevant part of a semiconductor light emitting device according to a fourth embodiment of the invention.

FIG. 9 is a schematic view illustrating the top side structure of a relevant part of a semiconductor light emitting device 41 according to a fourth embodiment of the invention.

Figure 10:
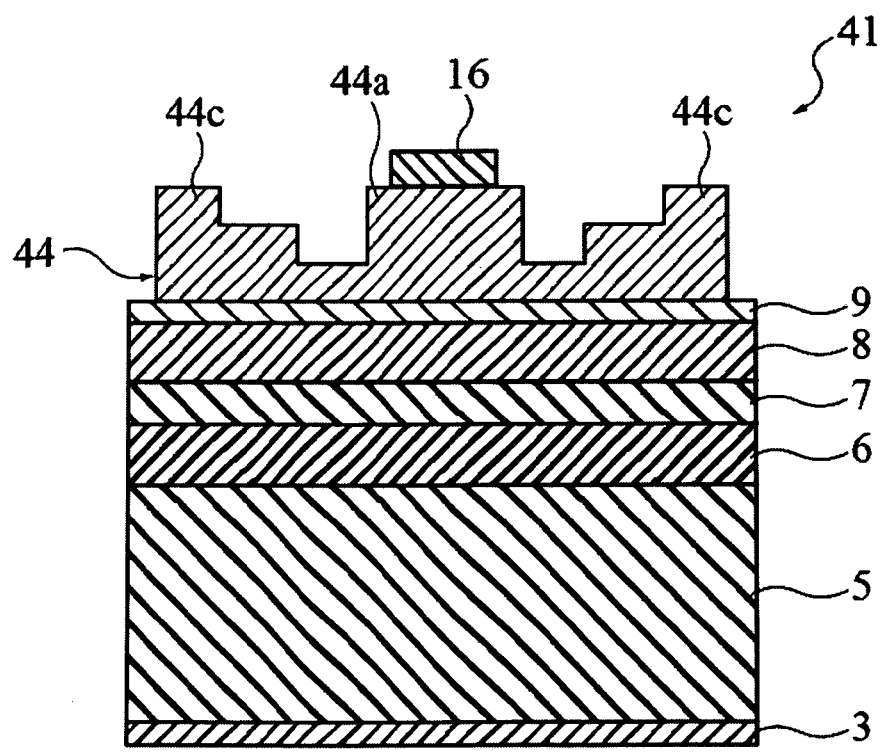
FIG. 10 is a cross section along line D-D in FIG. 9.

FIG. 10 is a cross section along line D-D in FIG. 9.

In this example, a conductive film 44 translucent to light emitted from the light emitting layer 7 is formed in three different levels of thickness. The conductive film 44 is provided on the contact layer 9 and steps are formed in a staircase pattern on the side opposite to the side contiguous to the contact layer 9. The side face of the step portion of the conductive film 44 is made substantially perpendicular to the light extraction surface.

A conductive film 44 includes a circular, first portion 44a provided substantially at its in-plane center, four second portions 44b extending radially from the first portion 44a toward the four corners of the conductive film 44, and a third portion 44c provided outside the second portions 44b. The first to third portions 44a to 44c have the same thickness, and are the thickest portions of the conductive film 44. The second portions 44b are each shaped as a line connected at one end to the first portion 44a and equally spaced along the circumferential direction of the first portion 44a. The other end of the second portion 44b is connected to the third portion 44c. An electrode 16 serving as a bonding pad is provided on top of the first portion 44a.

Between the first portion 44a and the third portion 44c, the regions other than the second portions 44b are thickened stepwise from the first portion 44a toward the third portion 44c. The thinnest portions are provided adjacent to the first portion 44a. The portions having an intermediate thickness between those of the thickest portions and the thinnest portions are provided between the thinnest portions and the third portion 44c.

In this example, the thickness of the conductive film 44 is increased stepwise from the vicinity of the center, where the electrode (bonding pad) 16 is located, toward the device periphery to facilitate current diffusion into a broad area throughout the light emitting layer 7. Furthermore, the second portions 44b extending radially from the center toward the periphery are thickened so as to function as a current diffusion path. This also facilitates current diffusion.

Moreover, current can be uniformly spread throughout the light emitting layer 7 in a balanced manner because the thick, first to third portions 44a to 44c of the conductive film 44 are symmetrically arranged with respect to the center of the light extraction surface.

Furthermore, the vicinity of the conductive film 44, where the opaque electrode (bonding pad) 16 is located and likely to decrease the amount of optical transmission, is made thinnest so as to increase the efficiency of light extraction from the vicinity of the center. Additionally, the conductive film 44 is not provided in the vicinity of the periphery of the top side of the contact layer 9, where light emitted from the light emitting layer 7 is extracted outside the device at high efficiency without reduction of the amount of transmission by the conductive film 44.

According to this example as well, part of the conductive film 44 is relatively thickened to facilitate current diffusion, and the remaining part is thinned to increase optical transmittance. This enables to increase the amount of light emission from the entire light emitting layer 7 and to improve the efficiency of extracting light emitted from the light emitting layer 7 to the outside of the device. Consequently, the semiconductor light emitting device 41 can be provided with higher brightness.

Fifth Embodiment

Figure 11:
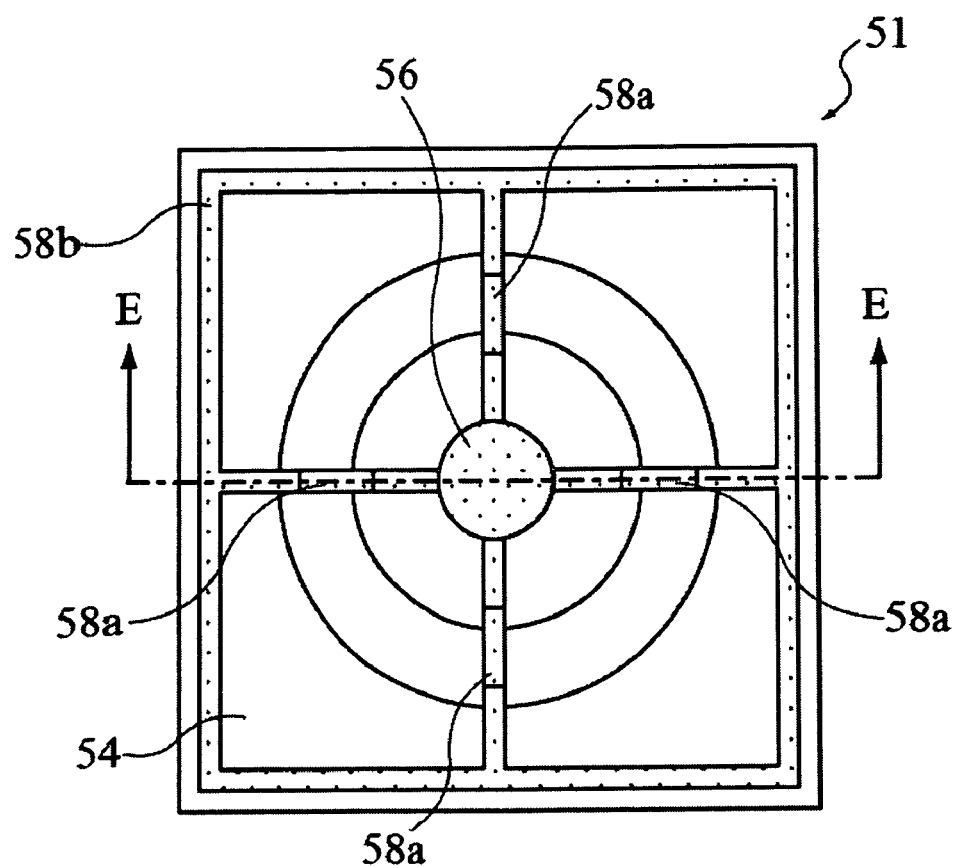
FIG. 11 is a schematic view illustrating the top side structure of a relevant part of a semiconductor light emitting device according to a fifth embodiment of the invention.

FIG. 11 is a schematic view illustrating the top side structure of a relevant part of a semiconductor light emitting device 51 according to a fifth embodiment of the invention.

Figure 12:
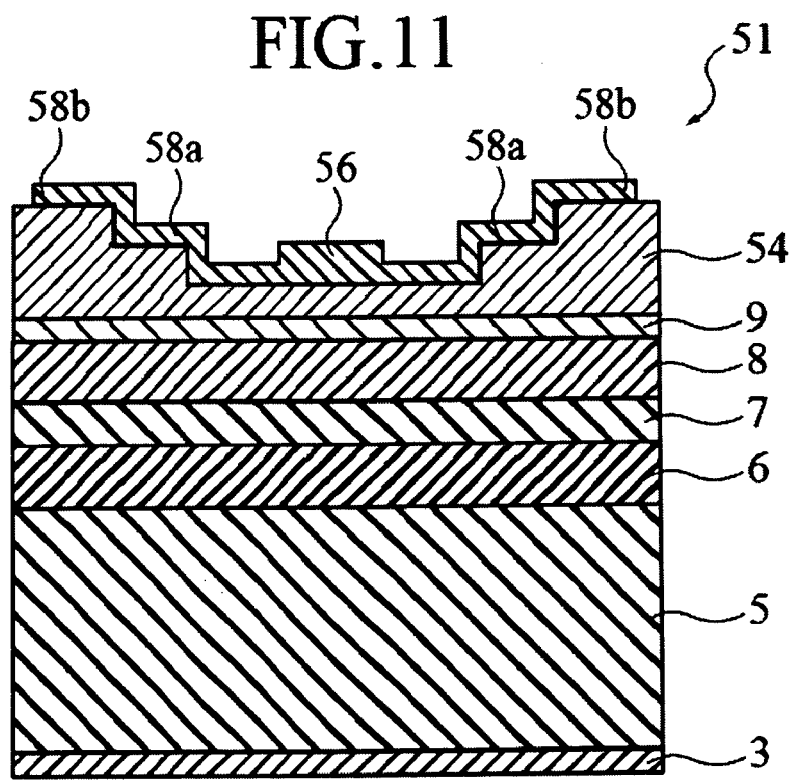
FIG. 12 is a cross section along line E-E in FIG. 11.

FIG. 12 is a cross section along line E-E in FIG. 11.

In this example, a conductive film 54 translucent to light emitted from the light emitting layer 7 is formed in three different levels of thickness. The conductive film 54 is provided on the contact layer 9 and steps are formed in a staircase pattern on the side opposite to the side contiguous to the contact layer 9. The side face of the step portion of the conductive film 54 is made substantially perpendicular to the light extraction surface.

The conductive film 54 is thickened stepwise from the center toward the periphery of the light extraction surface. The conductive film 54 is thinnest in the vicinity of the center of the light extraction surface, on which an electrode 56 serving as a bonding pad is provided. The thinnest portion of the conductive film 54 has a circular planar shape, which is surrounded by the second thickest portion. The region outside the second thickest portion is made thickest. In this way, the conductive film 54 is thickened stepwise with the distance from the electrode (bonding pad) 56 that receives current supply, thereby improving current diffusion in the vicinity of the periphery where current diffusion tends to be insufficient.

Furthermore, the vicinity of the center of the conductive film 54, where the opaque electrode (bonding pad) 56 is located and likely to decrease the amount of optical transmission, is made thinnest so as to increase the efficiency of light extraction from the vicinity of the center.

The electrodes provided on the conductive film 54 includes the above-described bonding pad or electrode 56, thin line electrodes 58a consisting of, e.g., four members and extending radially toward the periphery of the conductive film 54, and a thin line electrode 58b provided on the thickest portion of the conductive film 54 in the vicinity of its periphery and shaped as a rectangular frame. The thin line electrodes 58a are connected at one end to the electrode 56 and at the other end to the thin line electrode 58b, and extend between the electrode 56 and the thin line electrode 58b so as to cover the steps of the conductive film 54. These electrodes are made of metal or alloy material having lower resistance than the conductive film 54 like the first embodiment described above.

The thin line electrodes 58a, 58b facilitate improving current diffusion into the region far from the bonding pad or electrode 56. Furthermore, current can be uniformly spread throughout the light emitting layer 7 in a balanced manner because the thin line electrodes 58a, 58b and the stepwise pattern of the conductive film 54 are symmetrically arranged with respect to the center of the light extraction surface.

According to this example as well, part of the conductive film 54 is relatively thickened to facilitate current diffusion, and the remaining part is thinned to increase optical transmittance. This enables to increase the amount of light emission from the entire light emitting layer 7 and to improve the efficiency of extracting light emitted from the light emitting layer 7 to the outside of the device. Consequently, the semiconductor light emitting device 51 can be provided with higher brightness.

Sixth Embodiment

Figure 13:
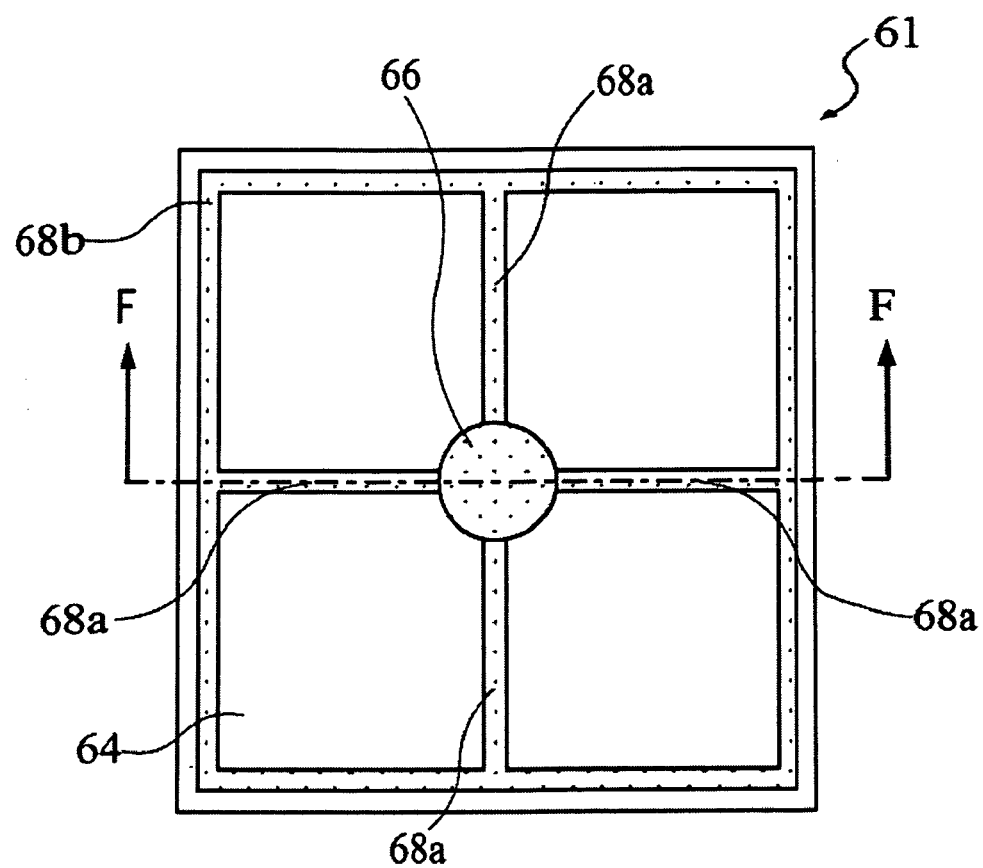
FIG. 13 is a schematic view illustrating the top side structure of a relevant part of a semiconductor light emitting device according to a sixth embodiment of the invention.

FIG. 13 is a schematic view illustrating the top side structure of a relevant part of a semiconductor light emitting device 61 according to a sixth embodiment of the invention.

Figure 14:
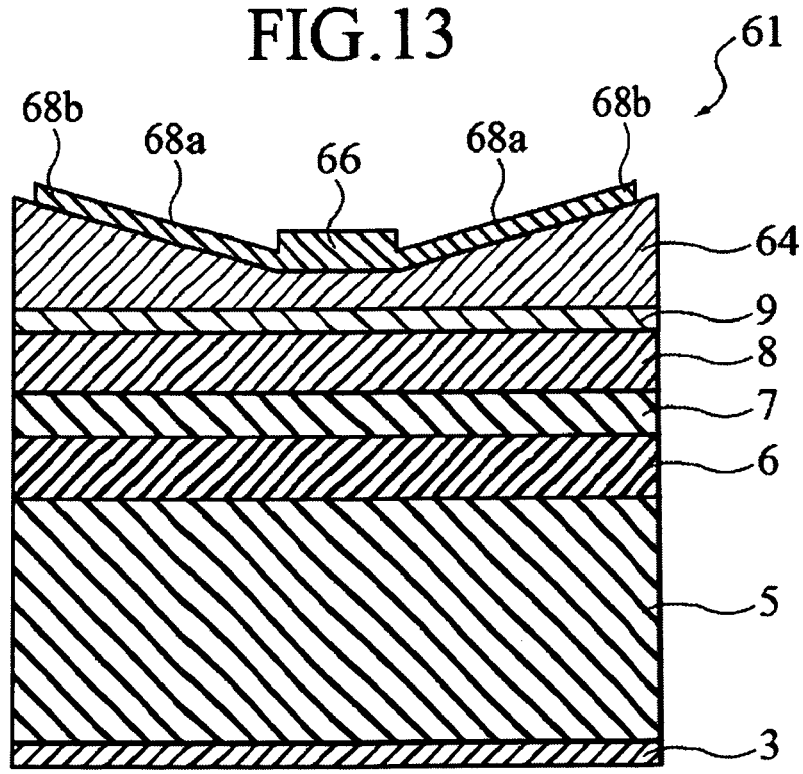
FIG. 14 is a cross section along line F-F in FIG. 13.

FIG. 14 is a cross section along line F-F in FIG. 13.

In this example, a conductive film 64 translucent to light emitted from the light emitting layer 7 has a sloped thickness. The conductive film 64 is provided on the contact layer 9 and a sloped surface having an upward slope from the center toward the periphery is formed on the side opposite to the side contiguous to the contact layer 9. In other words, the conductive film 64 is thinnest at the center where the bonding pad or electrode 66 is provided, and has a thickness varied continuously from the center toward the periphery.

Such a sloped surface can be obtained as follows, for example.

Figure 15:
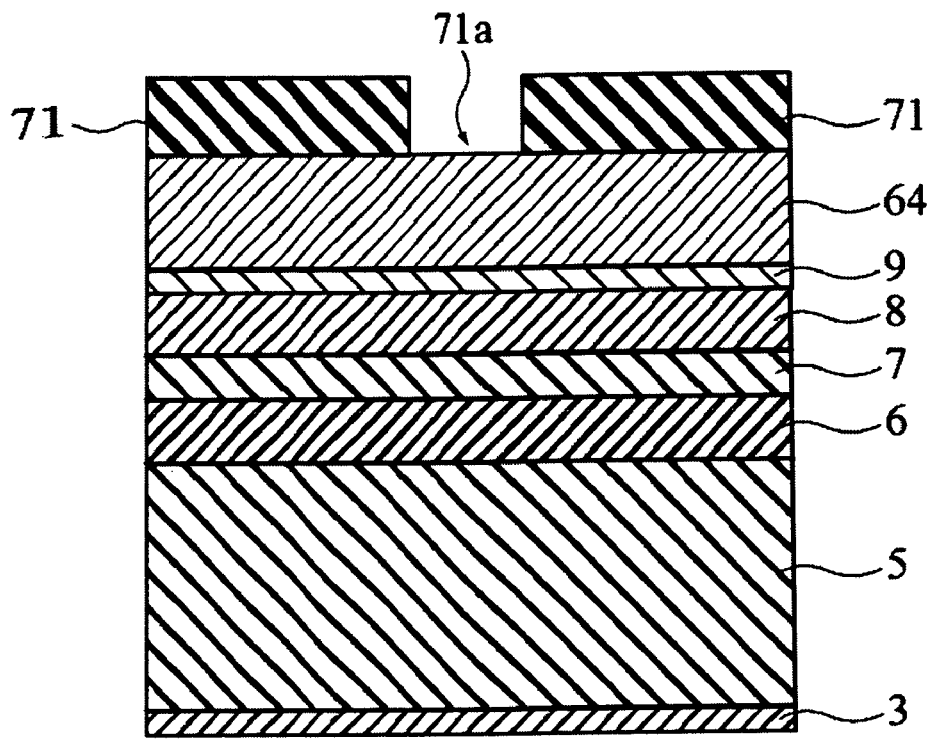
FIG. 15 is a process cross section illustrating a relevant part of a process of processing the conductive film of the semiconductor light emitting device shown in FIG. 14.
Figure 16:
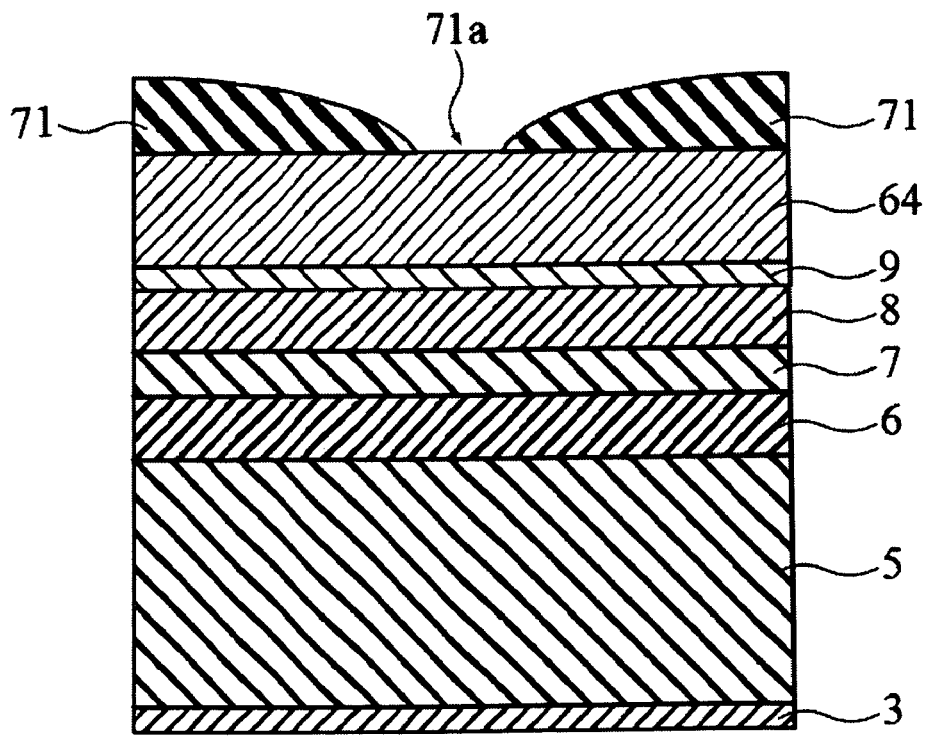
FIG. 16 is a process cross section continued from FIG. 15.

First, as shown in FIG. 15, a conductive film 64 is formed on the semiconductor laminated body 5 to 9 by methods such as sputtering, for example, and an etching mask 71 made of resin material, for example, is then formed on the top side of the conductive film 64. The etching mask 71 has an opening 71a at a position corresponding to the center of the conductive film 64 where it is to be made thinnest.

Next, the etching mask 71 is heat treated to mitigate the step in the vicinity of the opening 71a. This provides the etching mask 71 with a moderate slope that has a film thickness gradually decreasing from the periphery toward the opening 71a. Next, anisotropic etching is performed halfway through the conductive film 64 together with the mask 71. This causes the underlying conductive film 64 to be also etched back along the top side shape of the mask 71, and the top side shape of the mask 71 is transferred to the top side of the conductive film 64. As a result, the sloped surface described above is formed in the conductive film 64.

According to this example, the conductive film 64 is thickened gradually in a continuous manner with the distance from the electrode (bonding pad) 66 that receives current supply, thereby improving current diffusion in the vicinity of the periphery where current diffusion tends to be insufficient. Furthermore, the vicinity of the center of the conductive film 64, where the opaque electrode (bonding pad) 66 is located and likely to decrease the amount of optical transmission, is thinned so as to increase the efficiency of light extraction from the vicinity of the center.

The electrodes provided on the conductive film 64 includes the bonding pad or electrode 66, thin line electrodes 68a consisting of, e.g., four members and extending radially toward the periphery of the conductive film 64, and a thin line electrode 68b provided in the vicinity of the periphery of the conductive film 64 and shaped as a rectangular frame. The thin line electrodes 68a are connected at one end to the electrode 66 and at the other end to the thin line electrode 68b, and extend between the electrode 66 and the thin line electrode 68b along the slope of the top side of the conductive film 64. These electrodes are made of metal or alloy material having lower resistance than the translucent conductive film 64.

The thin line electrodes 68a, 68b facilitate improving current diffusion into the region far from the bonding pad or electrode 66. Furthermore, current can be uniformly spread throughout the light emitting layer 7 in a balanced manner because the thin line electrodes 68a, 68b are symmetrically arranged with respect to the center of the light extraction surface.

According to this example, the thickness of the conductive film 64 is continuously varied rather than being made uniform to provide for compatibility between improved current diffusion and optical transmission, which results in increased brightness of the semiconductor light emitting device 61.

Furthermore, in this example, the sloped surface, which is sloped relative to the light extraction surface and formed on the top side of the conductive film 64, also provides a lens effect for refracting light extracted outside the device toward the focusing direction.

Figure 17:
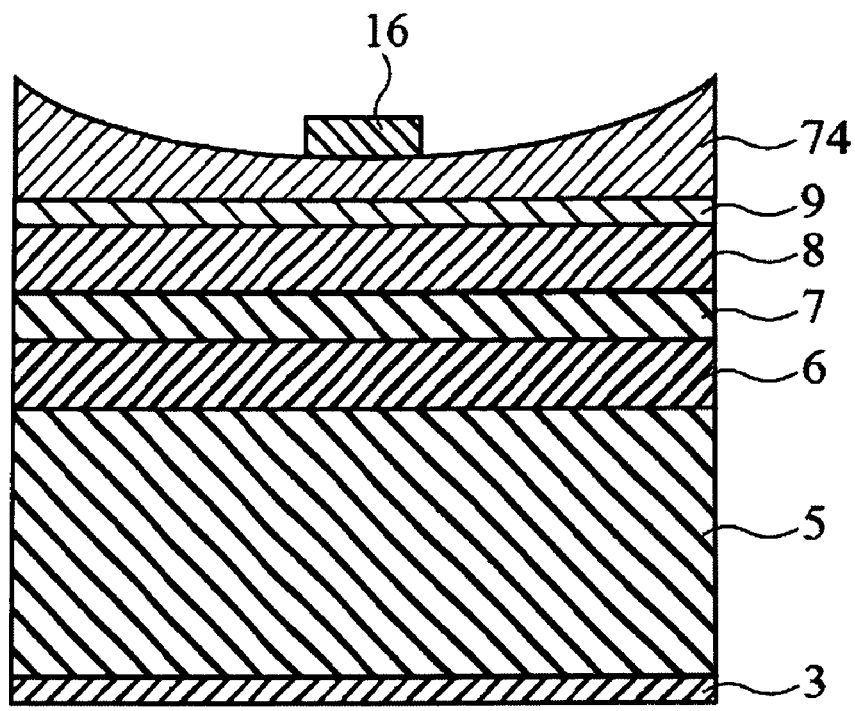
FIG. 17 is a schematic cross section showing a variation of the semiconductor light emitting device shown in FIG. 14.

The configuration for continuously varying the thickness of the conductive film is not limited to a sloped surface on the top side of the conductive film, but may be a curved surface, like a conductive film 74 shown in FIG. 17. Furthermore, it is not limited to a concave surface, but may be a convex surface.

Figure 18:
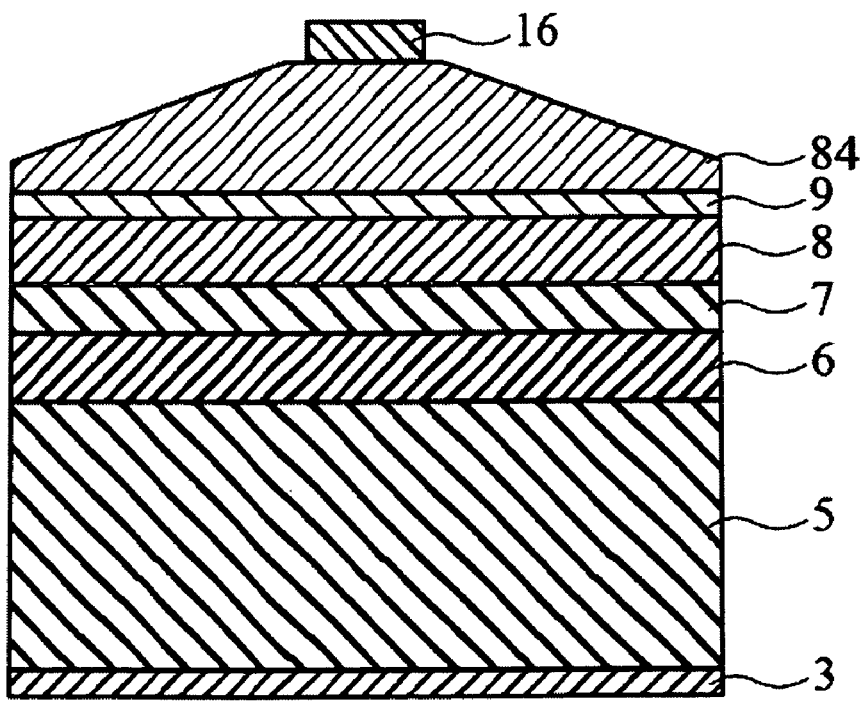
FIG. 18 is a schematic cross section showing another variation of the semiconductor light emitting device shown in FIG. 14.

Alternatively, like a conductive film 84 having a trapezoidal cross section shown in FIG. 18, the configuration may be such that the thickness continuously decreases toward the periphery from the center where the electrode (bonding pad) 16 is placed.

Seventh Embodiment

Next, a seventh embodiment of the invention will be described with reference to an example application to a semiconductor light emitting apparatus equipped with the semiconductor light emitting device. More specifically, any of the semiconductor light emitting devices described above with reference to the first to sixth embodiments (the semiconductor light emitting devices being hereinafter denoted collectively by reference numeral 101) can be mounted on a mounting member such as a lead frame or mounting board to obtain a high-brightness semiconductor light emitting apparatus.

Figure 19:
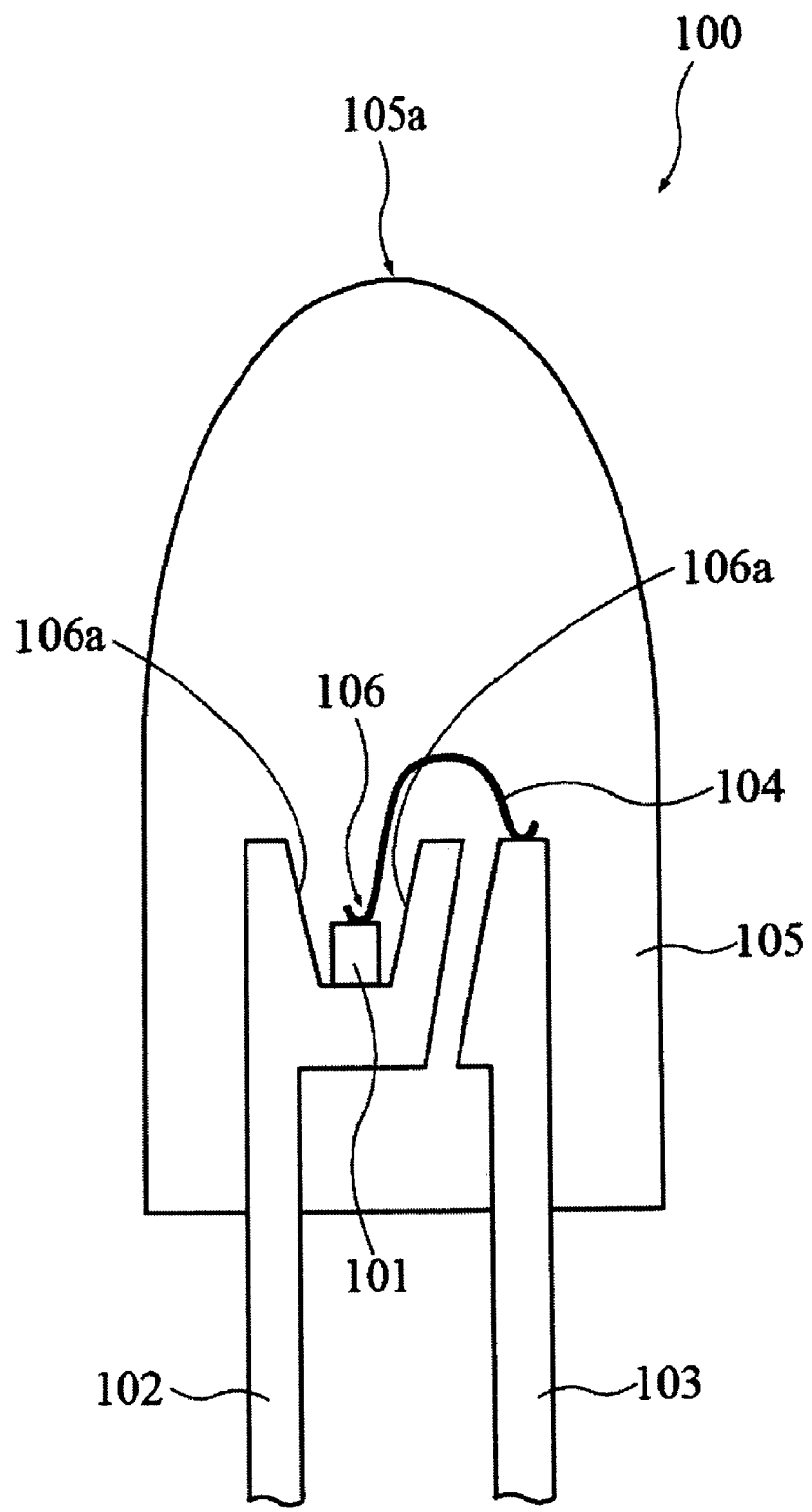
FIG. 19 is a schematic view illustrating the cross-sectional structure of a relevant part of a semiconductor light emitting apparatus according to an embodiment of the invention.

FIG. 19 is a schematic cross-sectional view showing an exemplary semiconductor light emitting apparatus of the seventh embodiment. More specifically, the semiconductor light emitting apparatus 100 of this example is a resin-sealed semiconductor light emitting apparatus called the "bullet-shaped" type.

A cup portion 106 is provided on top of a lead 102. The semiconductor light emitting device 101 is mounted on the bottom face of the cup portion 106 with conductive paste or the like. The electrode (bonding pad) on the top side of the semiconductor light emitting device 101 is electrically connected to another lead 103 using a wire 104. The inner wall 106a of the cup portion 106 constitutes a light reflecting surface, which reflects light emitted from the semiconductor light emitting device 101 and allows the light to be extracted above.

The cup portion 106 is sealed with translucent resin 105. The light extraction surface 105a of the resin 105 forms a condensing surface, which can condense the light emitted from the semiconductor light emitting device 101 as appropriate to achieve a predetermined light distribution.

The semiconductor light emitting apparatus 100 of this example thus achieves high brightness by using any of the semiconductor light emitting devices described above with reference to FIGS. 1 to 18.

Figure 20:
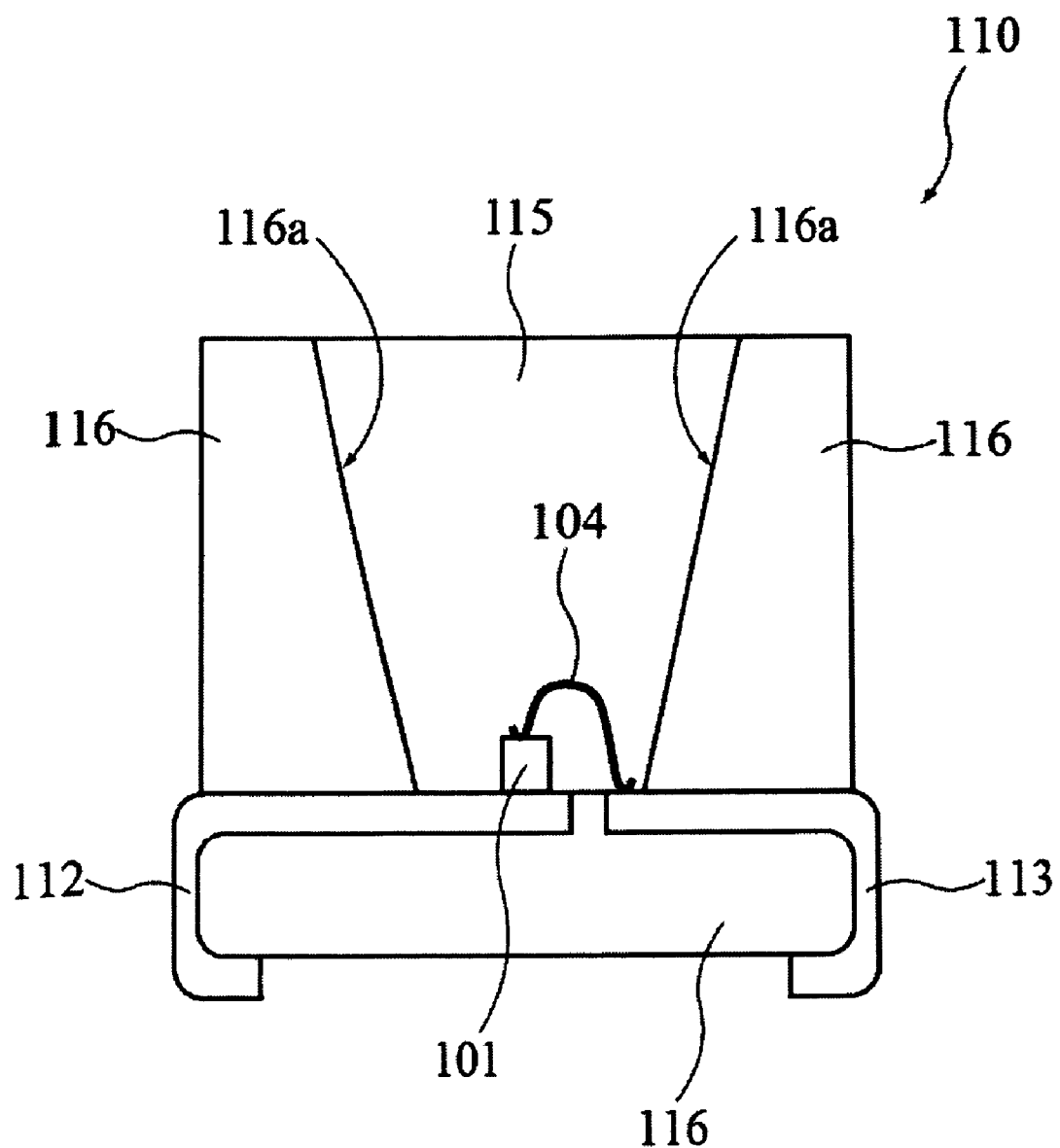
FIG. 20 is a schematic view illustrating the cross-sectional structure of a relevant part of a semiconductor light emitting apparatus according to another embodiment of the invention.

FIG. 20 is a schematic cross-sectional view showing another example of the semiconductor light emitting apparatus. The semiconductor light emitting apparatus 110 of this example is called the "surface mounted" type. The semiconductor light emitting device 101 is mounted on a lead 112 via conductive paste or the like. The electrode (bonding pad) on the top side of the semiconductor light emitting device 101 is electrically connected to another lead 113 using a wire 104. These leads 112 and 113 are molded in first resin 116. The semiconductor light emitting device 101 is sealed with second translucent resin 115. The first resin 116 has an enhanced light reflectivity by dispersion of fine particles of titanium oxide, for example. Its inner wall 116a acts as a light reflecting surface to guide the light emitted from the semiconductor light emitting device 101 to the outside.

Embodiments of the invention have been described with reference to the examples. However, the invention is not limited to these examples, but various modifications can be made on the basis of the spirit of the invention.

It is not necessarily required to provide a bonding pad substantially at the center of the top side of the device and to radially provide thick portions of a conductive film serving as a current diffusion path so that they are symmetrically arranged. However, symmetrical arrangement of the bonding pad and the thick portions of the conductive film is more advantageous to ensuring uniform emission direction and brightness of output light.

On the other hand, the p-side and n-side electrodes may be provided on the same major surface side of the substrate.

Figure 21:
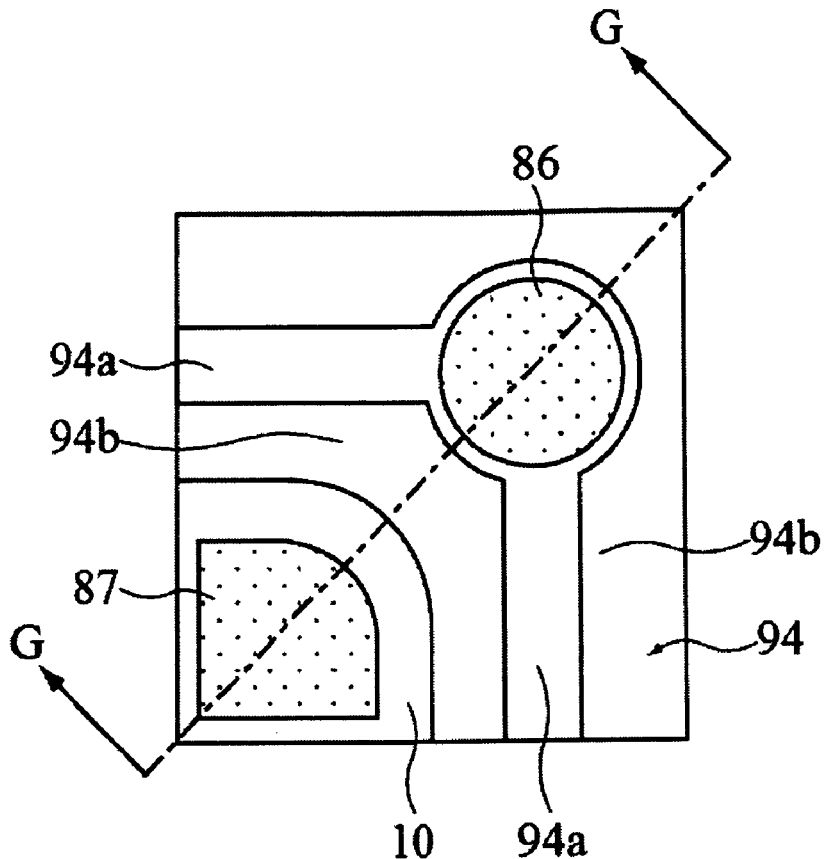
FIG. 21 is a schematic view illustrating the top side structure of a relevant part of a semiconductor light emitting device according to a variation of the invention.

FIG. 21 is a schematic view illustrating the top side structure of a relevant part of a semiconductor light emitting device having such configuration.

Figure 22:
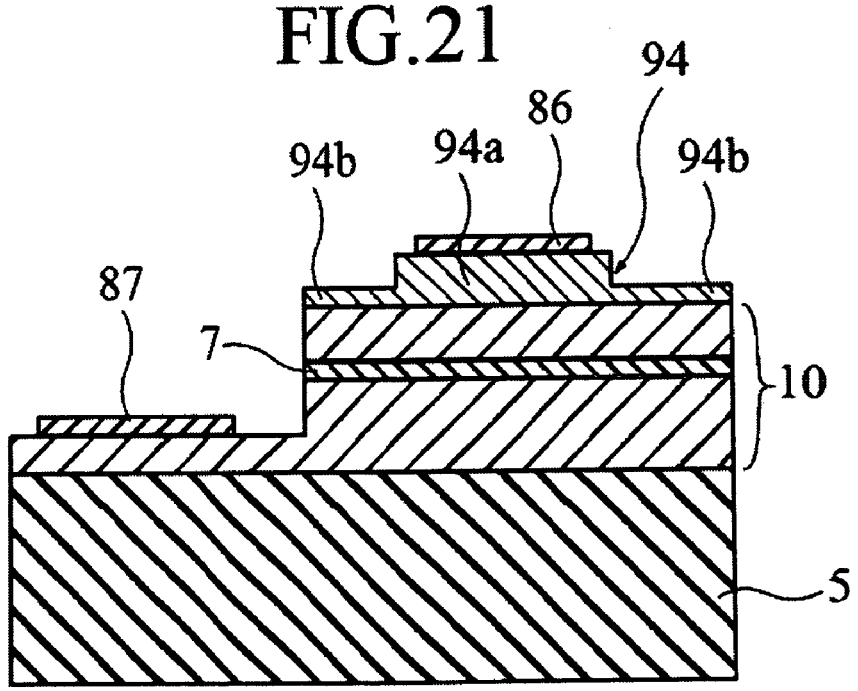
FIG. 22 is a cross section along line G-G in FIG. 21.

FIG. 22 is a cross section along line G-G in FIG. 21.

A semiconductor laminated body 10 having a step is provided on the major surface of a substrate 5. A conductive film 94 translucent to light emitted from the light emitting layer 7 is provided on the top side (light extraction surface) of the upper stand including the light emitting layer 7 in the semiconductor laminated body 10. An electrode 87 is provided on the top side of the lower stand.

The conductive film 94 has a large thickness portion 94a and a small thickness portion 94b having a smaller thickness than the large thickness portion 94a. The large thickness portion 94a consists of a circular portion provided in the vicinity of a corner (the upper-right corner in FIG. 21) of the light extraction surface and two extending portions adjacent thereto that extend to the periphery. An electrode 86 is provided on the circular portion. The electrodes 86 and 87 are both connected to an external circuit by wire bonding.

In this variation as well, part of the conductive film 94 is relatively thickened to facilitate current diffusion, and the remaining part is thinned to increase optical transmittance. This enables to increase the amount of light emission from the entire light emitting layer 7 and to improve the efficiency of extracting light emitted from the light emitting layer 7 to the outside of the device. Consequently, the semiconductor light emitting device can be provided with higher brightness.

It should be noted that light extraction is not limited to extraction from the top face of the semiconductor light emitting device, but may be extraction from the bottom or side face. Furthermore, the translucent conductive film is not necessarily required to be formed entirely on the light extraction surface of the device. Moreover, while the conductive film has two or three different levels of thickness in the examples described above, it may have more different levels of thickness.

Furthermore, the configuration and material of the semiconductor laminated body including the light emitting layer are not limited to the examples described above. Likewise, the material of the conductive film is not limited to the examples described above, but may be selected from materials being electrically conductive and translucent to part or all of the wavelength bands of light emitted from the light emitting layer.

Moreover, the film thickness difference between the thick portion and the thin portion in the conductive film is not limited to the value mentioned in the examples described above, but can be any film thickness difference that may cause a substantial difference in the device lateral electrical resistance and optical transmittance.

The invention claimed is:

1. A semiconductor light emitting device comprising:
    a semiconductor laminated body including a light emitting layer and having a light extraction surface for light emitted from the light emitting layer, the light extraction surface being substantially flat;
    a conductive film provided on the light extraction surface of the semiconductor laminated body and being translucent to the light emitted from the light emitting layer; and
    an electrode provided above the conductive film,
    the conductive film covering substantially all of the light extraction surface,
    a bottom surface of the conductive film being flat,
    the conductive film having a thicker portion and a thinner portion provided on the light extraction surface,
    a top surface of the thicker portion being substantially flat,
    a top surface of the thinner portion being substantially flat, and
    a step being formed on a surface of the conductive film between the thicker portion and the thinner portion.

2. A semiconductor light emitting device according to claim 1, wherein the conductive film comprises a metal compound.

3. A semiconductor light emitting device according to claim 1, wherein
    the conductive film has a first portion and a second portion, the second portion being adjacent to the first portion and extending toward the periphery,
    the electrode is provided at least above the first portion, and
    the first and second portions are the thickest portions of the conductive film.

4. A semiconductor light emitting device according to claim 3, wherein the first portion of the conductive film is provided substantially at the center of the light extraction surface, and the second portion of the conductive film is symmetrically arranged with respect to the center of the conductive film.

5. A semiconductor light emitting device according to claim 1, wherein the conductive film has a first portion provided substantially at the center of the light extraction surface, a second portion being adjacent to the first portion and extending toward the periphery, and a third portion being adjacent to the second portion and located outside the second portion so as to surround the second portion, the electrode is provided at least above the first portion, and the first, second, and third portions are the thickest portions of the conductive film.

6. A semiconductor light emitting device according to claim 5, wherein the second and third portions of the conductive film are symmetrically arranged with respect to the center of the conductive film.

7. A semiconductor light emitting device according to claim 1, wherein the electrode includes a bonding pad.

8. A semiconductor light emitting device according to claim 7, wherein the electrode further includes a thin line electrode connected to the bonding pad and extending toward the periphery of the conductive film.

9. A semiconductor light emitting device according to claim 7, wherein the bonding pad is provided substantially at the center of the conductive film, and the electrode further includes a first thin line electrode connected to the bonding pad and extending toward the periphery of the conductive film, and a second thin line electrode connected to the first thin line electrode and located outside the first thin line electrode so as to surround the first thin line electrode.

10. A semiconductor light emitting device according to claim 8, wherein the bonding pad is provided substantially at the center of the conductive film, and the thin line electrode is symmetrically arranged with respect to the center of the conductive film.

11. A semiconductor light emitting device according to claim 9, wherein the first and second thin line electrodes are symmetrically arranged with respect to the center of the conductive film.

12. A semiconductor light emitting device according to claim 9, wherein the first and second thin line electrodes are provided above a thick portion that protrudes from a thin portion in the conductive film.

13. A semiconductor light emitting device comprising:

a semiconductor laminated body including a light emitting layer and having a light extraction surface for light emitted from the light emitting layer, the light extraction surface being substantially flat;

a conductive film provided on the light extraction surface of the semiconductor laminated body and being translucent to the light emitted from the light emitting layer; and an electrode provided above the conductive film, the conductive film covering substantially all of the light extraction surface, a bottom surface of the conductive film being flat, a thickness of the conductive film varying continuously from a center portion toward a periphery, and a sloped or curved surface extending continuously from the center portion towards the periphery on a top surface of the portion of the conductive film.

14. A semiconductor light emitting device according to claim 13, wherein the conductive film comprises a metal compound.

15. A semiconductor light emitting device according to claim 13, wherein the electrode includes a bonding pad.

16. A semiconductor light emitting device according to claim 15, wherein the electrode further includes a thin line electrode connected to the bonding pad and extending toward the periphery of the conductive film.

17. A semiconductor light emitting device according to claim 15, wherein the bonding pad is provided substantially at the center of the conductive film, and the electrode further includes a first thin line electrode connected to the bonding pad and extending toward the periphery of the conductive film, and a second thin line electrode connected to the first thin line electrode and located outside the first thin line electrode so as to surround the first thin line electrode.

18. A semiconductor light emitting device according to claim 16, wherein the bonding pad is provided substantially at the center of the conductive film, and the thin line electrode is symmetrically arranged with respect to the center of the conductive film.

19. A semiconductor light emitting device according to claim 17, wherein the first and second thin line electrodes are symmetrically arranged with respect to the center of the conductive film.

20. A semiconductor light emitting apparatus comprising:

a mounting member;

a semiconductor light emitting device mounted on the mounting member; and resin sealing the semiconductor light emitting device, the semiconductor light emitting device having:

a semiconductor laminated body including a light emitting layer and having a light extraction surface for light emitted from the light emitting layer, the light extraction surface being substantially flat;

a conductive film provided on the light extraction surface of the semiconductor laminated body and being translucent to the light emitted from the light emitting layer; and an electrode provided above the conductive film, the conductive film covering substantially all of the light extraction surface, a bottom surface of the conductive film being flat, the conductive film having a thicker portion and a thinner portion provided on the light extraction surface, a top surface of the thicker portion being substantially flat, a top surface of the thinner portion being substantially flat, and a step being formed on a surface of the conductive film between the thicker portion and the thinner portion.

* * * * *